(12) United States Patent
Sasaki

(10) Patent No.: US 7,876,143 B2
(45) Date of Patent: Jan. 25, 2011

(54) PHASE SHIFTER

(75) Inventor: Takao Sasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/542,459

(22) Filed: Aug. 17, 2009

(65) Prior Publication Data

US 2009/0302919 A1 Dec. 10, 2009

(51) Int. Cl.
*H03H 11/16* (2006.01)
(52) U.S. Cl. ..................................... 327/231; 327/254
(58) Field of Classification Search ........................ None
See application file for complete search history.

(56) References Cited

U.S. PATENT DOCUMENTS 6,160,434 A * 12/2000 Yoshimura et al. .......... 327/238
RE37,452 E * 11/2001 Donnelly et al. ............. 327/255
6,456,143 B2 * 9/2002 Masumoto et al. .......... 327/356

FOREIGN PATENT DOCUMENTS

| JP | 5746322 | 3/1982 |
|---|---|---|
| JP | 58056522 | 4/1983 |
| JP | 08237077 | 9/1996 |

OTHER PUBLICATIONS

International Search Report dated Apr. 10, 2007.

* cited by examiner

*Primary Examiner*—Cassandra Cox
(74) *Attorney, Agent, or Firm*—Fujitsu Patent Center

(57) ABSTRACT

A phase shifter includes a phase shifting unit for operating at a timing at which a clock signal becomes equal to or greater than a threshold value and outputting periodic signals having phases shifted by 90 degrees from each other; a DC voltage setting unit for setting a voltage value of a DC component of the clock signal input into the phase shifting means; and a clock signal slope varying unit for varying a slope of a rising edge of the clock signal.

7 Claims, 18 Drawing Sheets

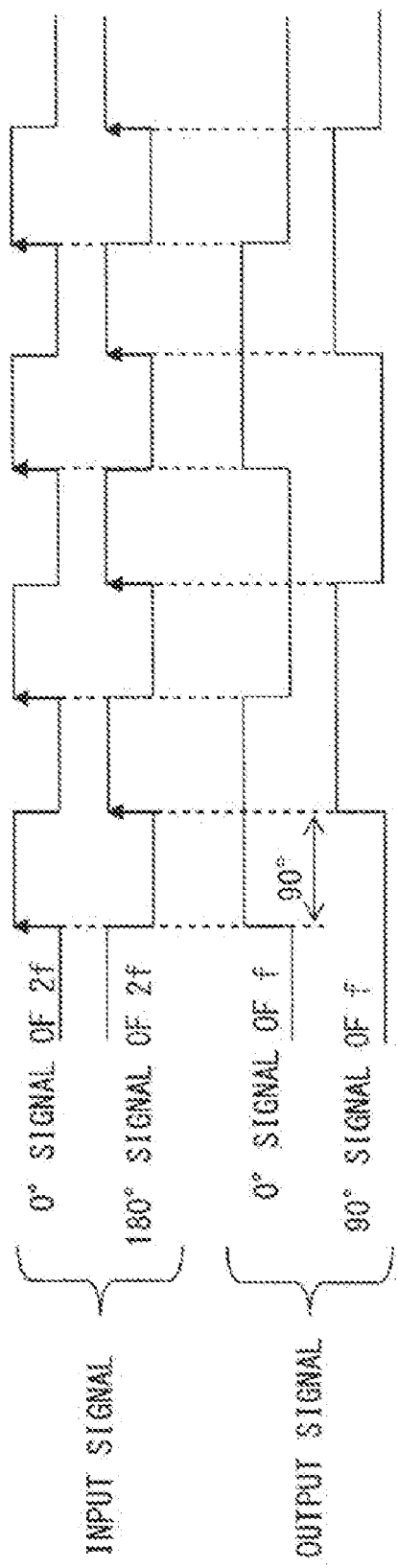

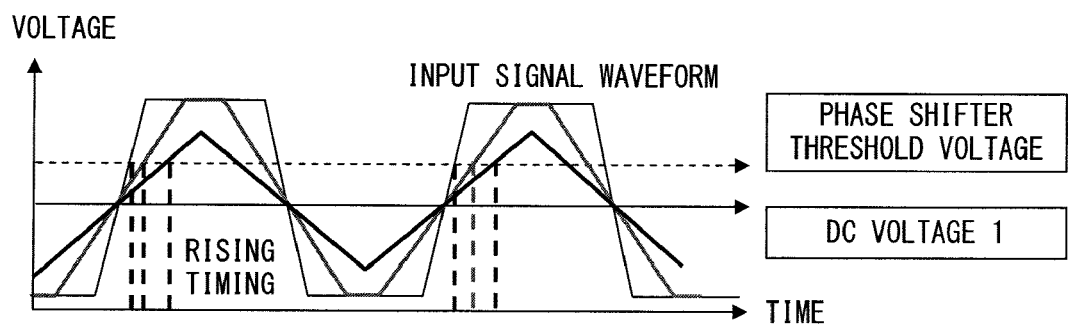
F I G. 7 B

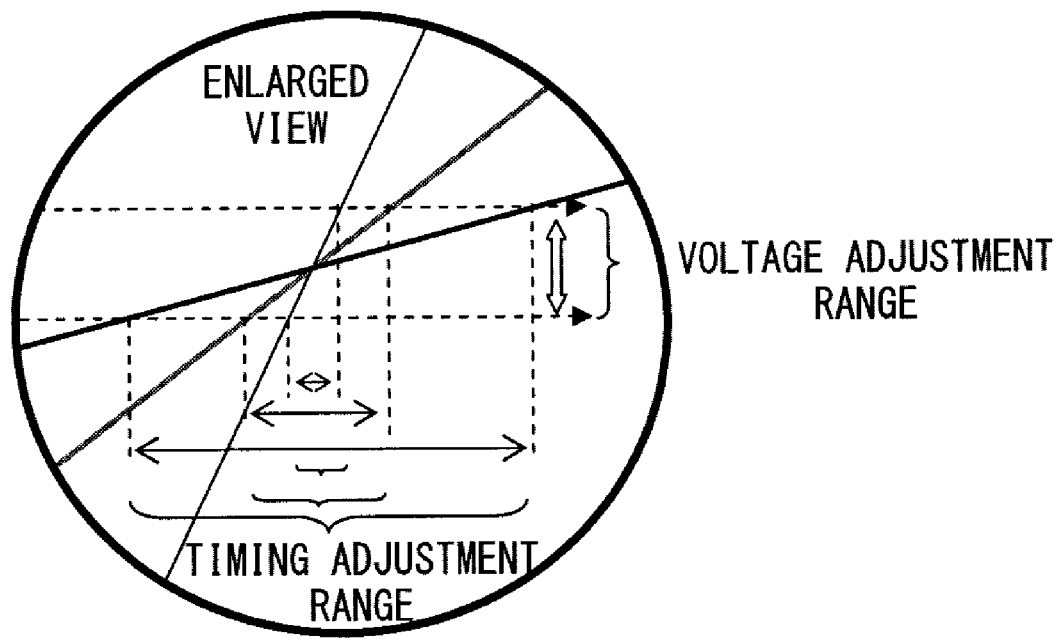
F I G. 7 C

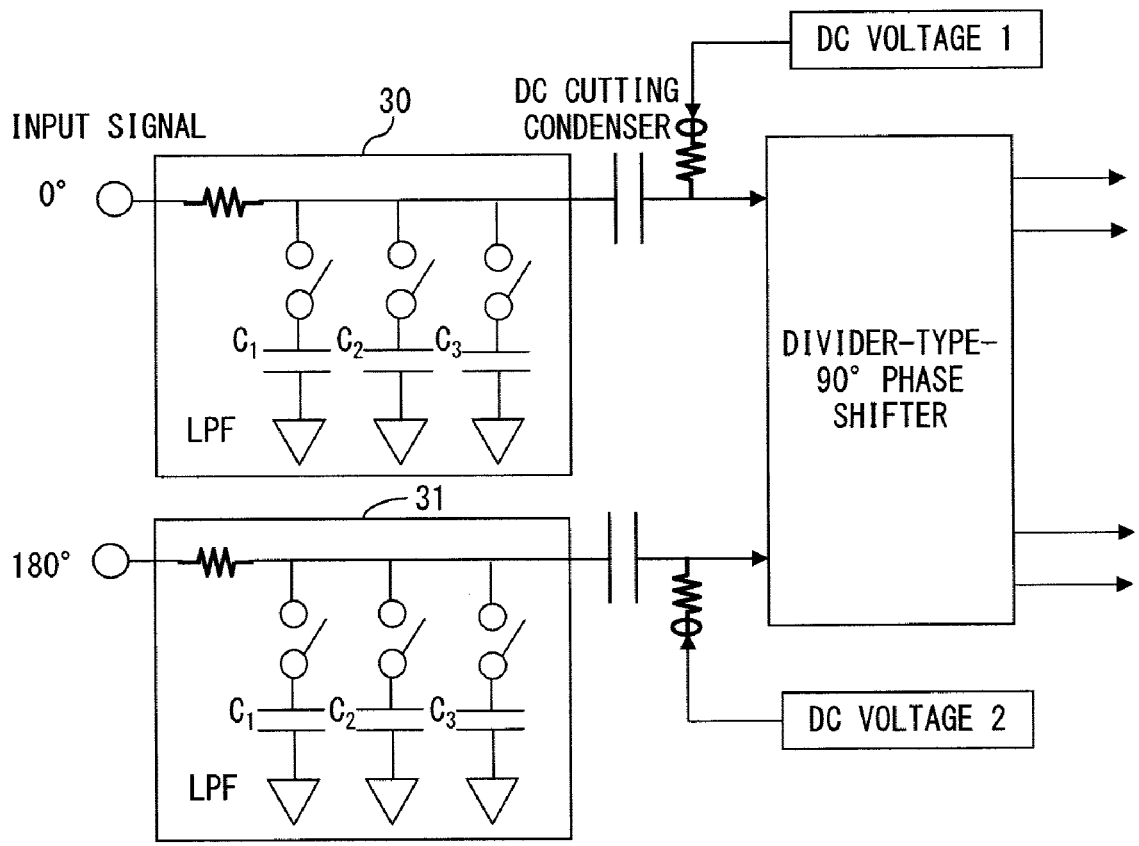
F I G. 8A

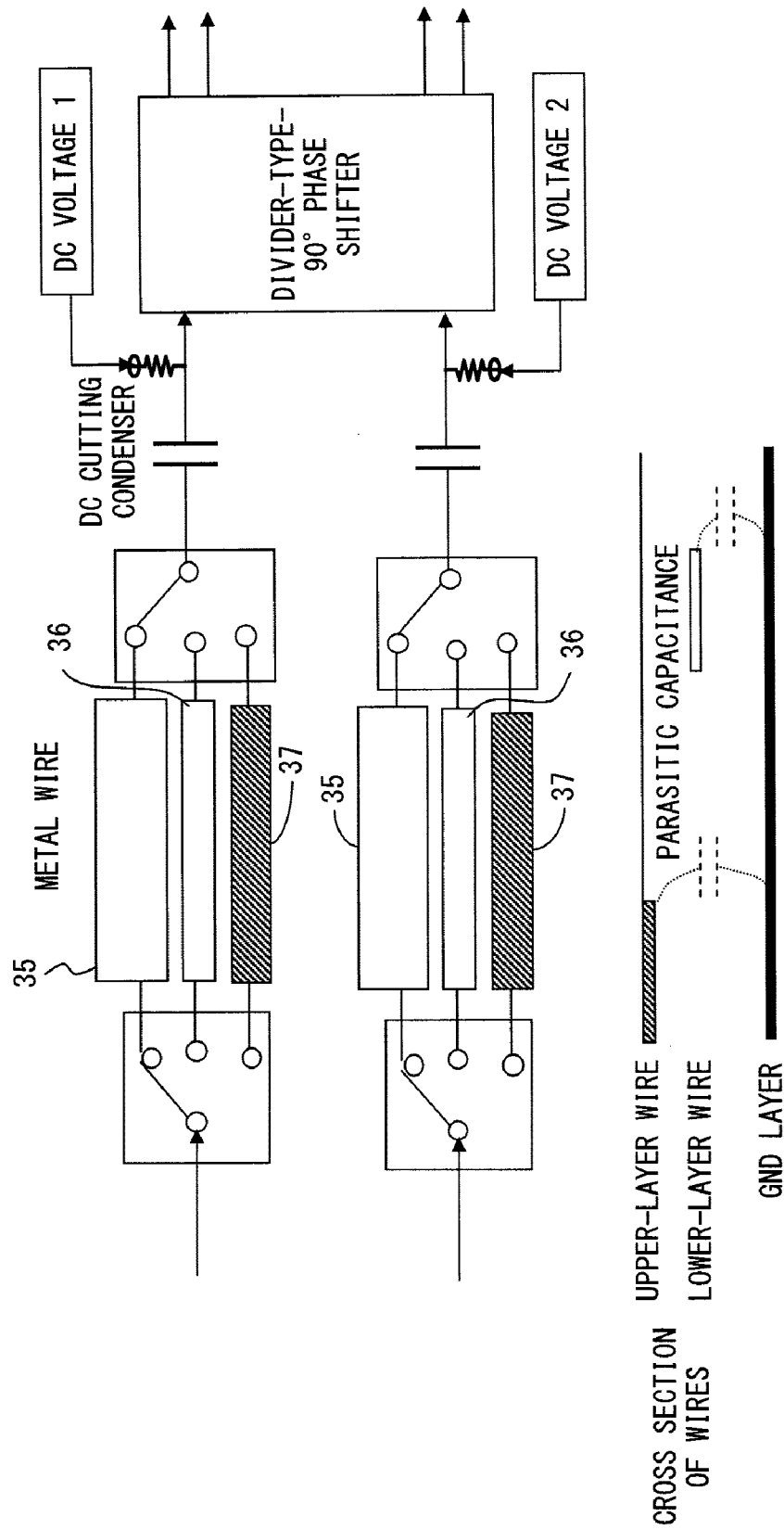
F I G. 13

PHASE SHIFTER

CROSS-REFERENCE TO RELATED APPLICATION

This application is based upon and claims the benefit of priority of the prior International Patent Application No. PCT/JP2007/000174, filed on Mar. 6, 2007, the entire contents of which are incorporated herein by reference.

FIELD

The embodiments discussed herein are related to a 90° phase shifter for local oscillator signals used in a radio circuit.

BACKGROUND

In recent years, wireless system services such as mobile phones, wireless LAN, etc. have employed higher frequency bands, and have employed multilevel modulation or multiplexing methods using reduced spacing between carrier waves in order to increase their communication capacity. This type of wireless system often use quadrature modems, and local oscillator signals thereof are required to be of a high phase accuracy in order to secure an acceptable communications quality.

FIGS. 1A and 1B illustrate phase shifters used in commonly used radio transceivers.

FIG. 1A illustrates a quadrature demodulator used in a receiver. FIG. 1B illustrates a quadrature modulator used in a transmitter. In FIG. 1B, a received signal is amplified by a receiving amplifier 10, and is branched so as to be input into mixers 11-1 and 11-2 in the quadrature demodulator. An oscillator 15 generates a local oscillator signal, and the generated local oscillator signal is input into a phase shifter 14. In the phase shifter 14, a 0° signal, which is not phase-shifted, and a 90°-phase-shifted signal, which is phase-shifted by 90 degrees, are generated from the local oscillator signal so as to be input into the mixers 11-1 and 11-2, respectively. The received signal that is down-converted by the mixer 11-1 for receiving 0° signals is changed into an I-signal. The I-signal is passed through a low-pass filter 12-1 and an amplifier 13-1 so as to be changed into a demodulated baseband signal. Meanwhile, the received signal that is down-converted by the mixer 11-2 for receiving 90° signals is changed into a Q-signal, and is passed through a low-pass filter 12-2 and an amplifier 13-2 so as to be changed into a demodulated baseband signal.

Also in FIG. 1B, an oscillator 16 generates local oscillator signals, and a phase shifter 17 generates a 0° signal and a 90° signal to be input into mixers 20-1 and 20-2, respectively. The modulated baseband signal that is an I-signal is passed through an amplifier 18-1 and a low-pass filter 19-1 to be input into the mixer 20-1 to be up-converted, and is input into a transmitting amplifier 21. The modulated baseband signal that is a Q-signal is passed through an amplifier 18-2 and a low-pass filter 19-2 to be input into the mixer 20-2 to be up-converted, and is input into the transmitting amplifier 21. The transmitting amplifier 21 amplifies a signal obtained by synthesizing the signals that are results of the up-conversions of the I-signal and the Q-signal, and treats the resultant signal as a transmission signal.

A 0° signal and a 90° signal are generated from a local oscillation signal of a quadrature modem by using, for example, a 90° phase shifter of a dividing type. However, phase shifts caused by element processes or production variations have to be adjusted for quadrature demodulators to meet the requirement of high phase accuracy, and a 90° phase shifter needs a function of performing this adjustment.

FIGS. 2A and 2B illustrate operations of a 90° phase shifter of a dividing type.

Differential signals, i.e., a 0° signal and a 180° signal, are input to obtain a desired frequency signal with the phases being shifted by 90 degrees. Operation at the rising edge of a frequency signal two times higher, i.e., a signal with a phase shifted by 180 degrees, can produce a phase difference of 90 degrees.

As illustrated in FIG. 2A, differential signals made of a 0° signal and a 180° signal of a frequency of 2 f are used as input signals. The DC components are eliminated by a condenser. DC voltage sources 26 and 27 newly give DC components to the signals. Thereafter, the signals are input into a divider-type-90° phase shifter 25, and differential signals with phases at 0 degree and 90 degrees are obtained as output signals of frequency f.

FIG. 2B illustrates operations of a divider-type-90° phase shifter. A 0° signal and a 180° signal each having a frequency of 2 f are used as input signals. The divider-type-90° phase shifter 25 varies the signal values of the two input signals only at the rising edges of the signals so that a 0° output signal having a frequency f is obtained from a 0° input signal, and a 90° phase output signal having a frequency f is obtained from a 180° input signal.

FIGS. 3 and 4 illustrate an example of the circuit of a 90° phase shifter and its detailed configuration.

In FIG. 3, a 0° signal that was input is input into the inverted clock terminal of D latch (1) and the clock terminal of D latch (2). A 180° signal that was input is input into the clock terminal of D latch (1) and the inverted clock terminal of D latch (2). A normal output of D latch (1) is a 90° signal of the output signal, and it is input into the normal input terminal of D latch (2). An inverted output of D latch (1) is input into the inverted input terminal of D latch (2). A normal output of D latch (2) is a 0° signal of the output signal, and it is input into the inverted terminal of D latch (1). An inverted output of D latch (2) is input into the normal terminal of D latch (1).

Operations on a 0° input signal are explained. D latch (1) reads input (D) at the falling edge of (A) to output it to (B). This (B) becomes an output 90° signal. D latch (2) reads input (B) at the rising edge of (A), and outputs it to (C). This (C) becomes an output 0° signal. Accordingly, the signal value of the output 90° signal is varied at the timing of the rising edge of the input 0° signal, and the signal value of the input 0° signal is varied at the timing of the rising edge of the input 0° signal.

For the determination of the clock inputs and the inverted clock inputs in D latches (1) and (2), threshold values are set in the latches so that the individual latches input and output signals when the input clock signal exceeds the threshold value.

FIG. 4 is a timing chart for explaining the operation of the 90° phase shifter illustrated in FIG. 3.

Signal (B) is a signal output from D latch (1) that has read signal (D) at the rising edge of signal (A). Signal (C) is a signal output from D latch (2) that has read signal (B) at the rising edge of signal (A). Accordingly, the output 0° signal becomes signal (C), and the output 90° signal becomes signal (B).

FIG. 5 illustrates a conventional method of adjusting a phase in a divider-type-90° phase shifter.

The timing of the rising edge of a signal is adjusted by changing the DC voltage of the input signal so that the phase difference of an output signal is adjusted. The chart denoted by (1) in FIG. 5 represents a case of a 0° signal in which a signal is input with a lower DC voltage than the threshold voltage of the phase shifter in order to delay the timing of the point where the waveform of the input signal and the threshold value intersect. Thereby, the timing of the 0° signal can be delayed. The chart denoted by (2) in FIG. 5 illustrates a case of a 90° phase signal in which a signal is input with a higher DC voltage than the threshold voltage of the phase shifter in order to advance the timing of the point where the waveform of the input signal and the threshold value intersect. Thereby, the timing of the 90° phase signal can be advanced. Thus, the rising and falling edges are formed at the timings where the waveform of the input signal and the threshold value intersect, and accordingly, the phase difference can be reduced by implementing charts (1) and (2) in FIG. 5 at the same time in order to delay the timing of the 0° signal and advance the timing of the 90° signal. The procedures opposite to the above can increase the phase difference between the signals.

However, the range and steps of adjusting DC voltages are limited due to shifts in threshold values in phase shifters caused by element processes or production variations, or due to changes in waveforms of input signals caused by variations in speeds of transistors in the input signal circuits, and the like, and this may prevent the obtainment of a desirable phase adjustment range.

FIG. 6 illustrates a problem in a conventional technique.

As indicated by (1) in FIG. 6, in the technique of Patent Document 1, the adjustment range of DC voltages tend to be concentrated in the upper or lower side with respect to the threshold value of the phase shifter when there is a difference between the threshold voltage of the phase shifter and the DC voltage of an input signal due to the element processes or production variations, and consequently a situation occurs where the timing of the rising edge of output signals can be adjusted to be delayed to a large extent while the timing can be adjusted to be advanced only to a small extent, or vice versa. When a timing adjustment has to be made to a large extent in the direction in which an adjustment is only allowed to a small extent, the phase difference of the input signal cannot be adjusted sufficiently, which is problematic. Also, when the rising edge of the waveform of the input signal is steep as in FIG. 6, even a great change to the DC voltage of the input signal can cause only a narrow timing range of adjustment because of the steepness. Also, when a timing range of adjustment is narrow, a situation occurs where the phase difference of the output signal cannot be adjusted to the required level.

Patent Document 1:
Japanese Laid-open Patent Publication No. 58-56522

SUMMARY

A phase shifter of the present invention includes: phase shifting unit operating at a timing at which a clock signal becomes equal to or greater than a threshold value and outputting periodic signals having phases shifted by 90 degrees from each other; DC voltage setting unit for setting a voltage value of a DC component of the clock signal input into the phase shifting unit; and clock signal slope varying unit varying a slope of a rising edge of the clock signal.

The object and advantages of the invention will be realized and attained by means of the elements and combinations articularly pointed out in the claims.

It is to be understood that both the foregoing general description and the following detailed description are exemplary and explanatory and are not restrictive of the invention, as claimed

BRIEF DESCRIPTION OF DRAWINGS

FIG. 2B also illustrates operations of a dividing-type-90° phase shifter;

FIG. 7B illustrates operations of an embodiment of the present invention (1);

FIG. 7C illustrates operations of an embodiment of the present invention (1);

FIG. 8A illustrates operations of an embodiment of the present invention (2);

FIG. 13 illustrates an example of the fourth configuration of moderating rising edges of input signals.

DESCRIPTION OF EMBODIMENTS

FIGS. 7A through 10 illustrate operations in embodiments of the present invention.

Moderating the rising edge of the waveform of a signal input into the phase shifter as illustrated in FIG. 7 enables the changing of the timing of rising without changing the DC voltage. The more moderate the rising edge is, the more the phase changes with respect to changes in voltage so as to widen the range over which phases can be varied, and the more the scale of adjustment steps can be varied.

Figure 1A:
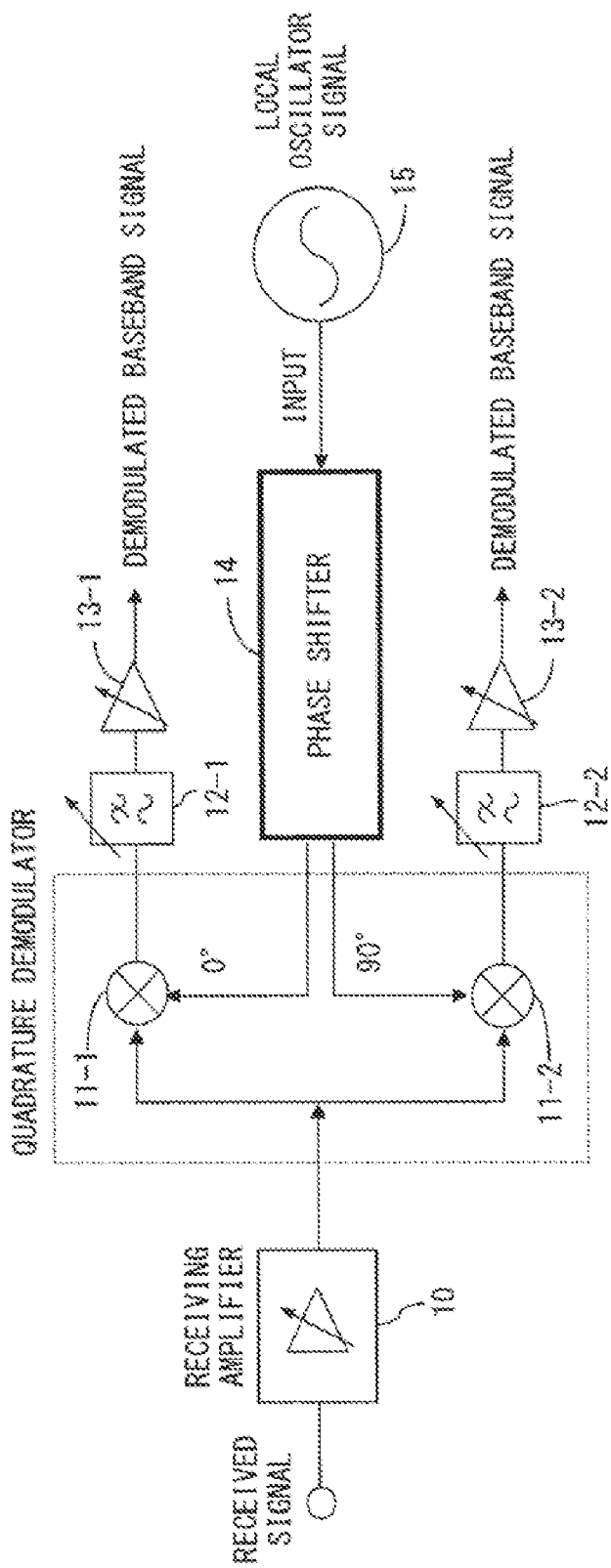
FIG. 1A illustrates a phase shifter used in a conventional wireless transceiver.
Figure 1B:
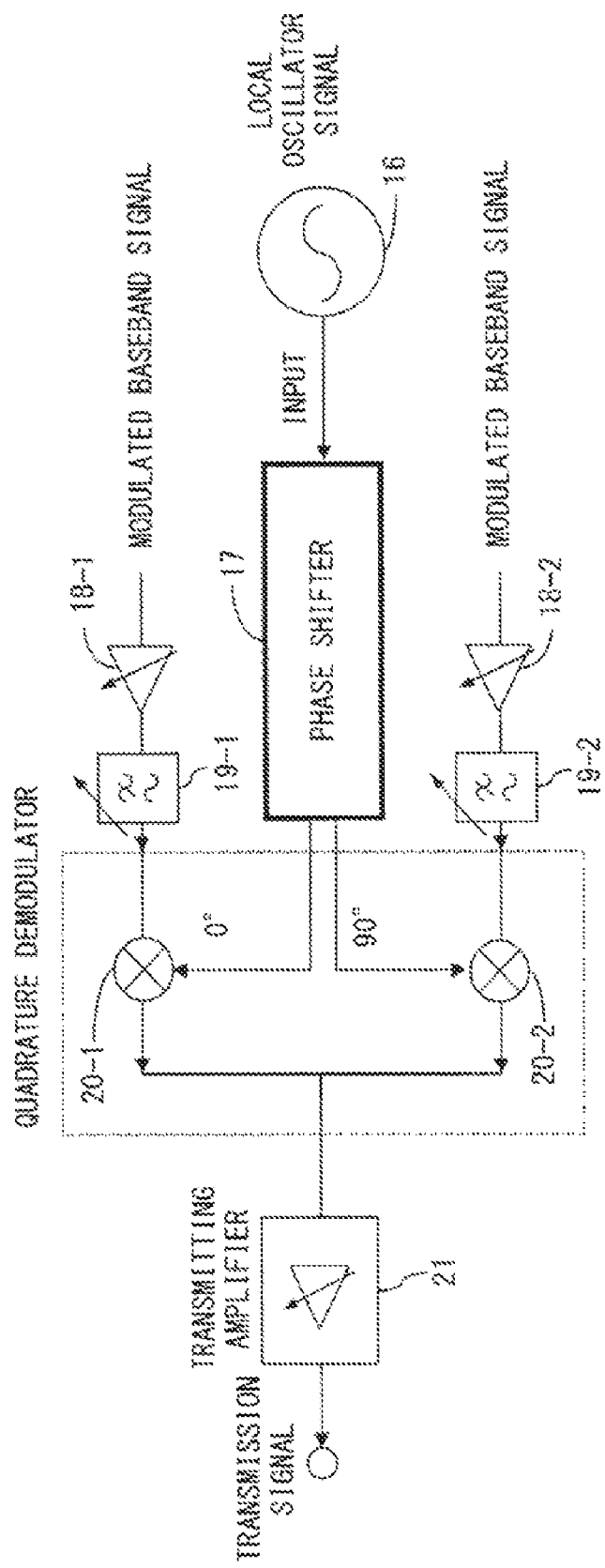
FIG. 1B also illustrates a phase shifter used in a conventional wireless transceiver.
Figure 2A:
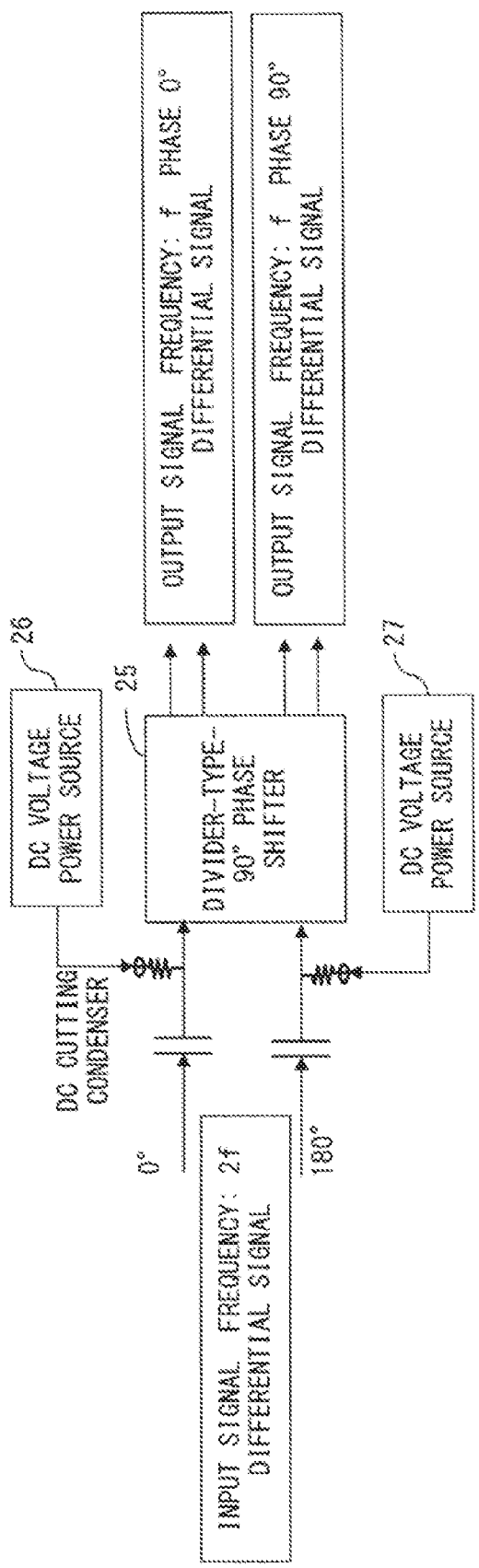
FIG. 2A illustrates operations of a dividing-type-90° phase shifter.
Figure 3:
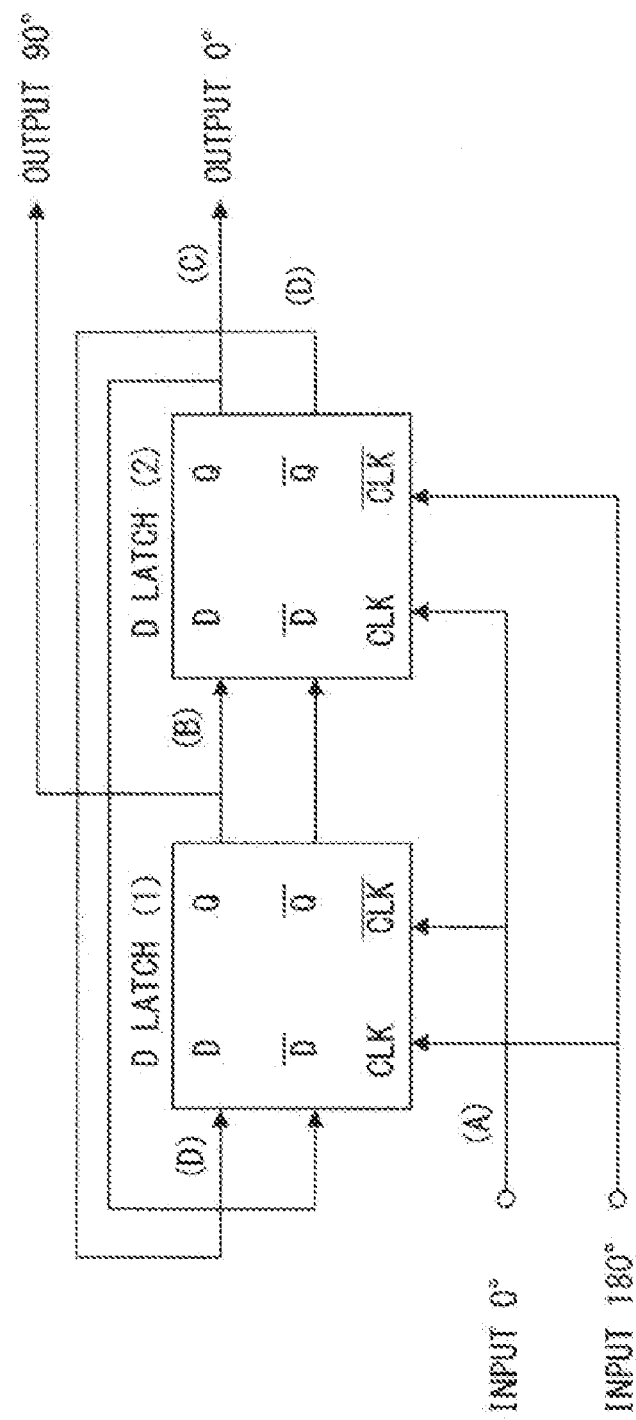
FIG. 3 is a first view illustrating an example of the circuit of a 90° phase shifter.
Figure 4:
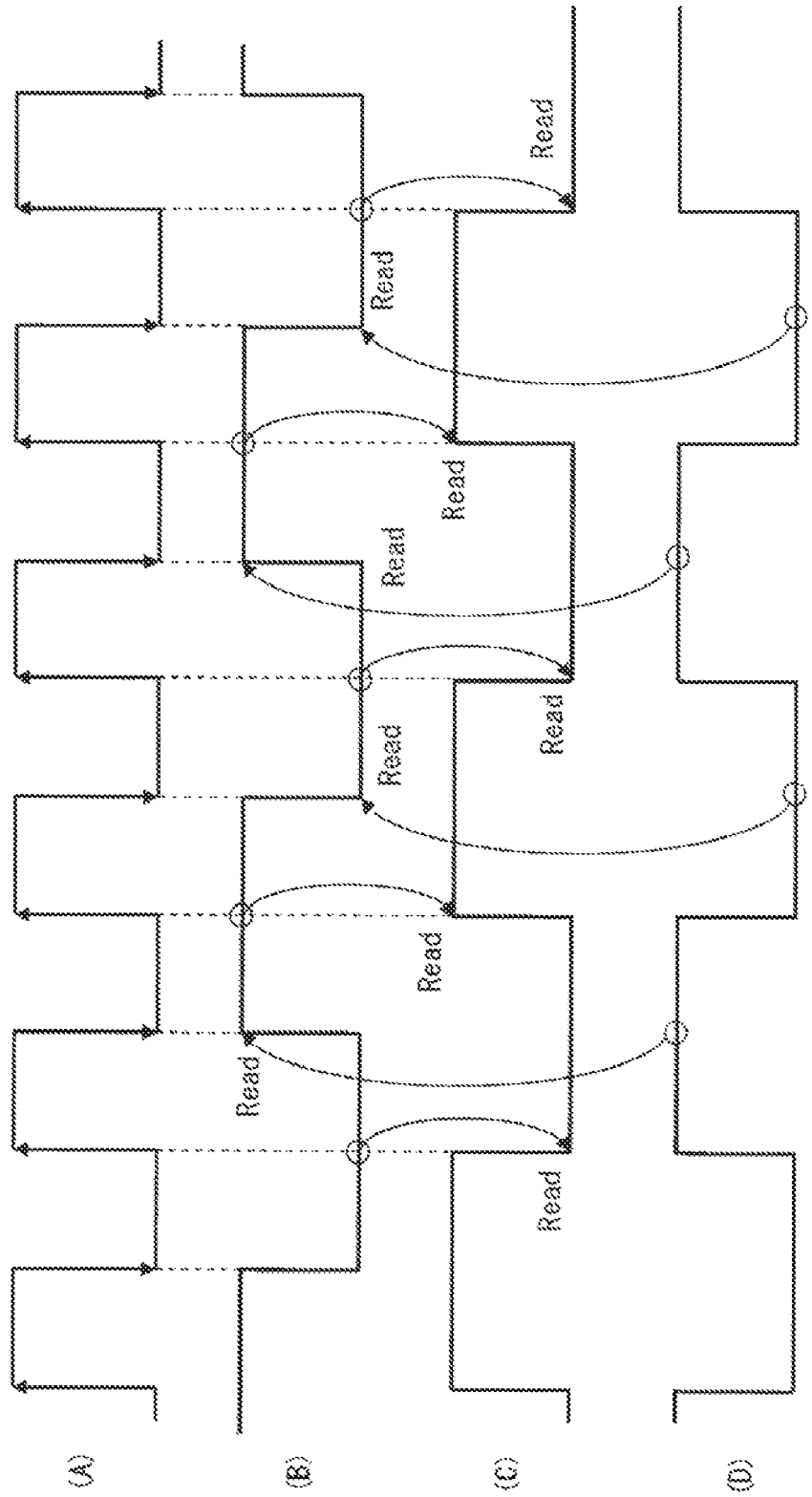
FIG. 4 is a second view illustrating an example of the circuit of the 90° phase shifter.
Figure 5:
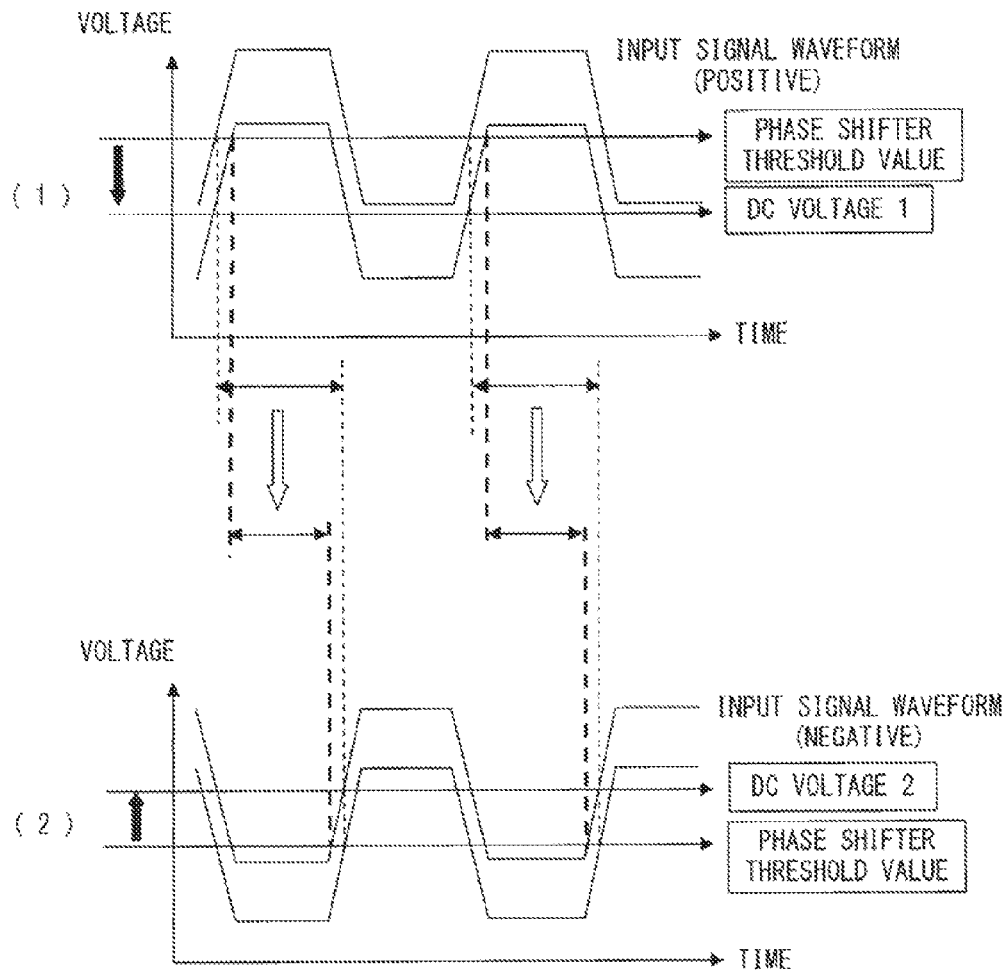
FIG. 5 illustrates a conventional method of shifting phases in a dividing-type-90° phase shifter.
Figure 6:
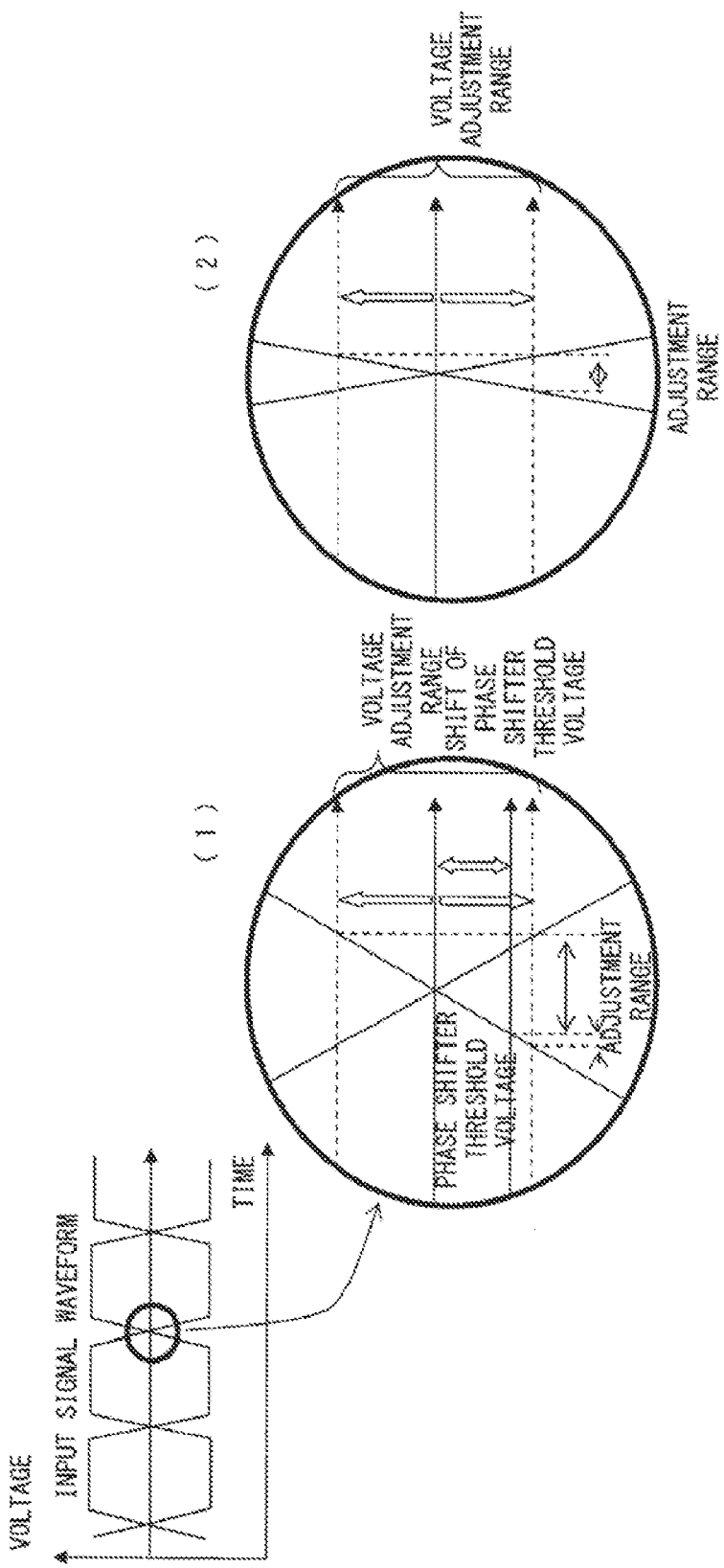
FIG. 6 illustrates a problem in a conventional technique.
Figure 7A:
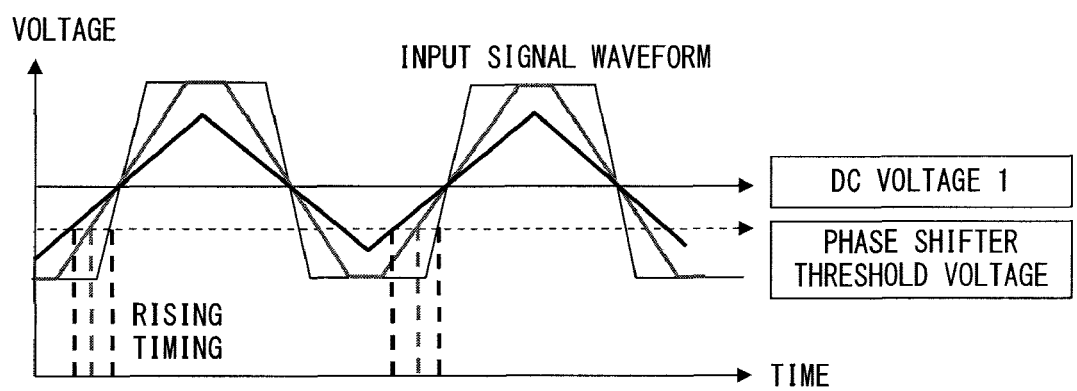
FIG. 7A illustrates operations of an embodiment of the present invention (1)

FIG. 7A illustrates a case where the DC voltage of the input signal is higher than the threshold voltage of the phase shifter and by moderating the rising of the waveform of the input signal, the rising timing of the output signal can be advanced to a greater extent. FIG. 7B illustrates a case where the DC voltage of the input signal is lower than the threshold voltage of the phase shifter and by moderating the rising of the waveform of the input signal, the rising timing of the output signal can be delayed to a greater extent. As illustrated in the enlarged view of FIG. 7C, the rising edge and the falling edge of the output signal are formed at timings at which the input signal waveform and the threshold voltage of the phase shifter intersect, and accordingly the more moderate the rising edge of the input signal waveform is, the wider the ranges are for adjusting the rising and falling timings of the output signal.

Figure 8B:
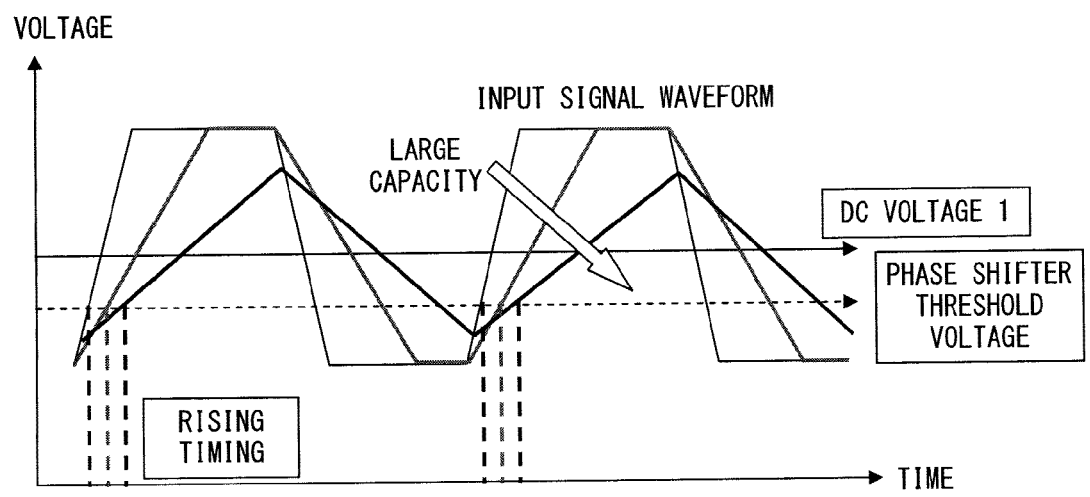
FIG. 8B illustrates operations of an embodiment of the present invention (2)

The situations illustrated in FIGS. 7A through 7C can be realized by providing a variable low-pass filter (LPF) for the input of the phase shifter and adjusting the time constant (cutoff frequency) of the low-pass filter so that a required timing adjustment range can be obtained as illustrated in FIG. 8A. Low-pass filters 30 and 31 are provided in stages earlier than condensers for cutting direct currents for both input 0° signals and input 180° signals. These Low-pass filters 30 and 31 have a same configuration. A plurality of capacitors C1 through C3 are connected, via switches, to each of the low-pass filters 30 and 31 so that the time constants of the low-pass filters are adjusted by operating the switches as necessary. The capacitors in the Low-pass filters 30 and 31 that are denoted by like symbols are configured to have like capacitances. FIG. 8B illustrates the waveforms of the signals input into the divider-type-90° phase shifter of the 0° signal side. The rising edges of the input signal waveforms become more moderate with increasing capacitances of the capacitors in the low-pass filters. Thereby, the range over which phases can be varied can be widened as illustrated in FIG. 7.

Figure 9:
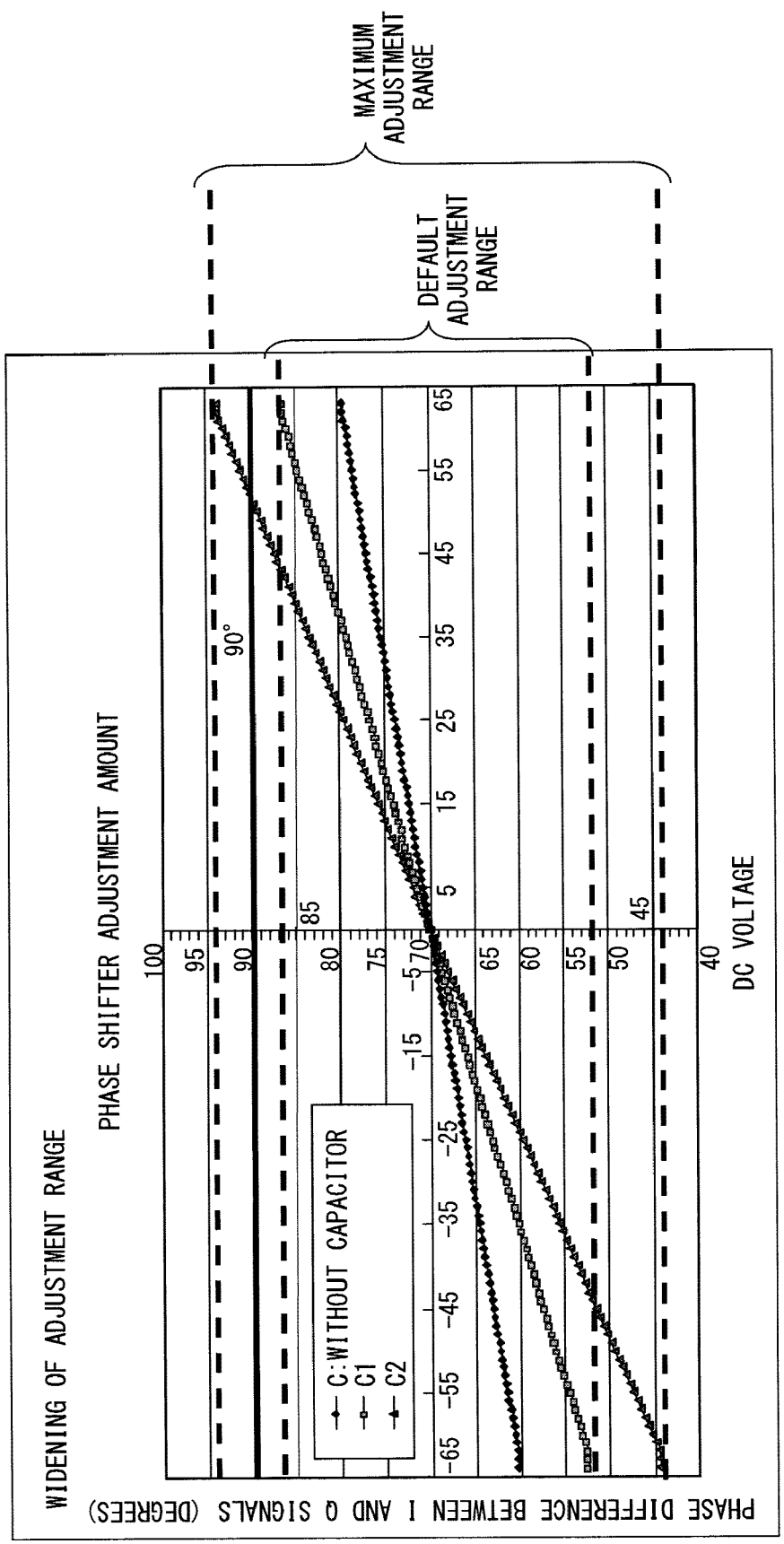
FIG. 9 illustrates operations of an embodiment of the present invention (3)
Figure 10:
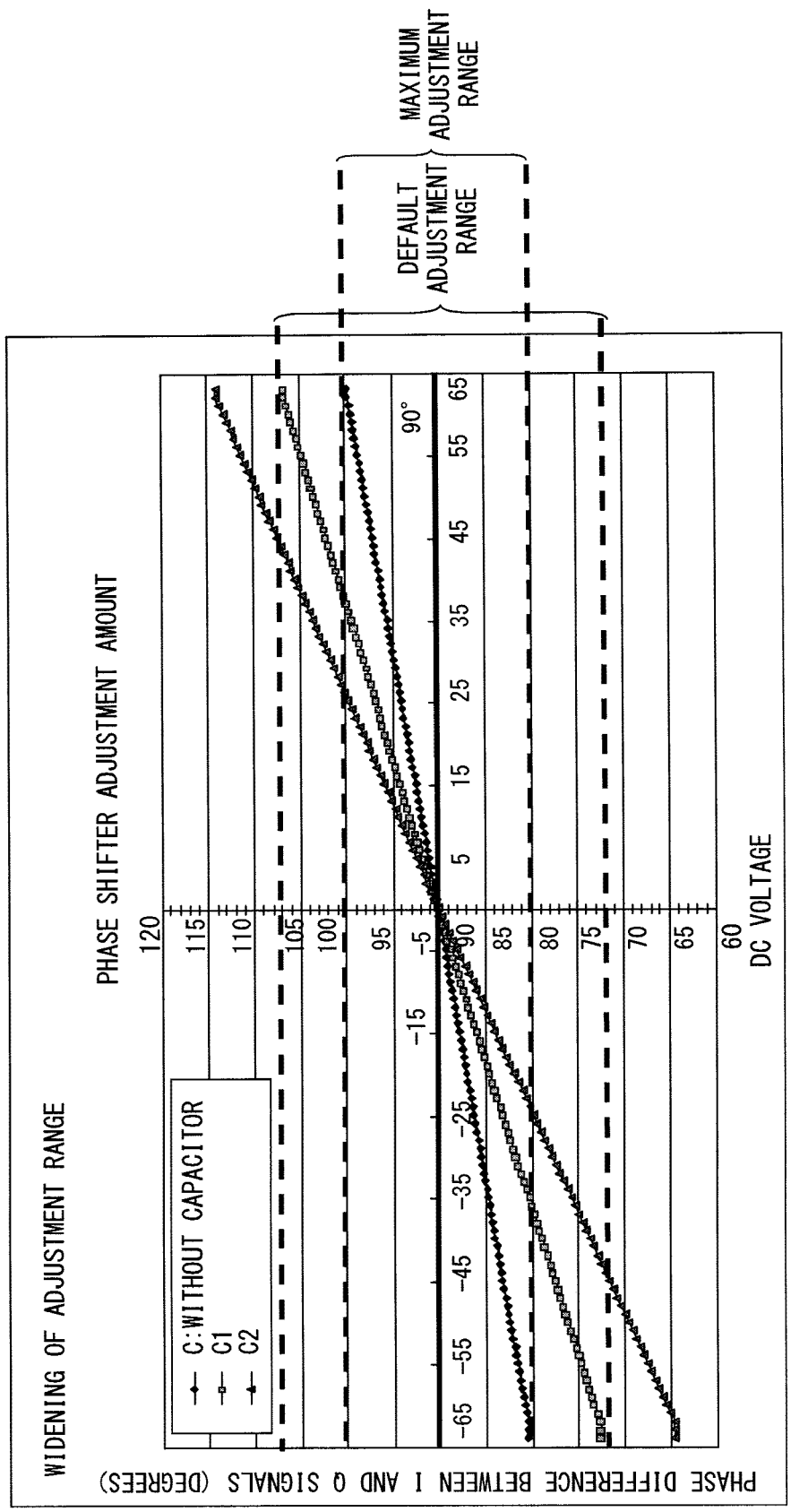
FIG. 10 illustrates operations of an embodiment of the present invention (4)

FIGS. 9 and 10 illustrate examples of setting phase adjustment amounts in phase shifters.

FIG. 9 illustrates an example of a phase adjustment amount in a phase shifter where the phase difference between the 0° signal (I-signal) and the 90° signal (Q-signal) output from the phase shifter is 70 degrees when the DC voltage of signal input into the phase shifter is 0. In a default state, capacitor C1 is connected to the low-pass filter and a case when a capacitor is not connected and a case when capacitor C2 with a larger capacitance than that of C1 can be connected are illustrated. The phase difference between the I-signal and the Q-signal should be 90 degrees, although it is actually 70 degrees, and this requires the adjustment of the phase of the output signal of the phase shifter. However, in the case illustrated in FIG. 9, capacitor C1 is connected by default, and even when the DC voltage of the input signal is changed to the maximum, the adjustment amount of the phase shifter does not reach 90 degrees. When there is no capacitor, the rising edge of the input signal becomes steep so as to narrow the adjustment range. When capacitor C2 is connected to the low-pass filter, the adjustment range is made wider and the adjustment amount of the phase shifter reaches 90 degrees. As described above, in the present embodiment, the characteristic of the low-pass filter is changed in order to moderate the rising edge of the waveform of the signal input into the phase shifter, and accordingly a sufficient phase adjustment amount can be obtained even when the required phase adjustment amount cannot be obtained in the default state.

FIG. 10 illustrates a case where the phase difference between the I-signal and the Q-signal is 90 degrees when the DC voltage of the signal input into the phase shifter is 0. The low-pass filter in this example can have three configurations, i.e., a configuration without capacitors, a configuration with capacitor C1 connected to itself, and a configuration with capacitor C2 having a larger capacitance than capacitor C1. By default, the low-pass filter includes capacitor C1 connected to itself. In the case of FIG. 10, the adjustment amount of the phase shifter has reached 90 degrees when the DC voltage is 0, and thus a large phase adjustment is not needed. Rather, a fine adjustment is desired. The use of capacitor C2 in a low-pass filter widens the adjustment range; however, the changing ratio of the phase shifter adjustment amount in units of changes in DC voltage increases, which prevents a fine adjustment. When a capacitor is not connected to a low-pass filter, the adjustment range remains narrow; however, the changing ratio of the phase shifter adjustment amount in units of changes in DC voltage is decreased as indicated by the decrease in the slope of the phase shifter adjustment amount in the graph of FIG. 10. Accordingly, the changing ratio of the phase shifter adjustment amount in units of changes in DC voltage is decreased, and thus a fine adjustment of phases can be performed.

Figure 11:
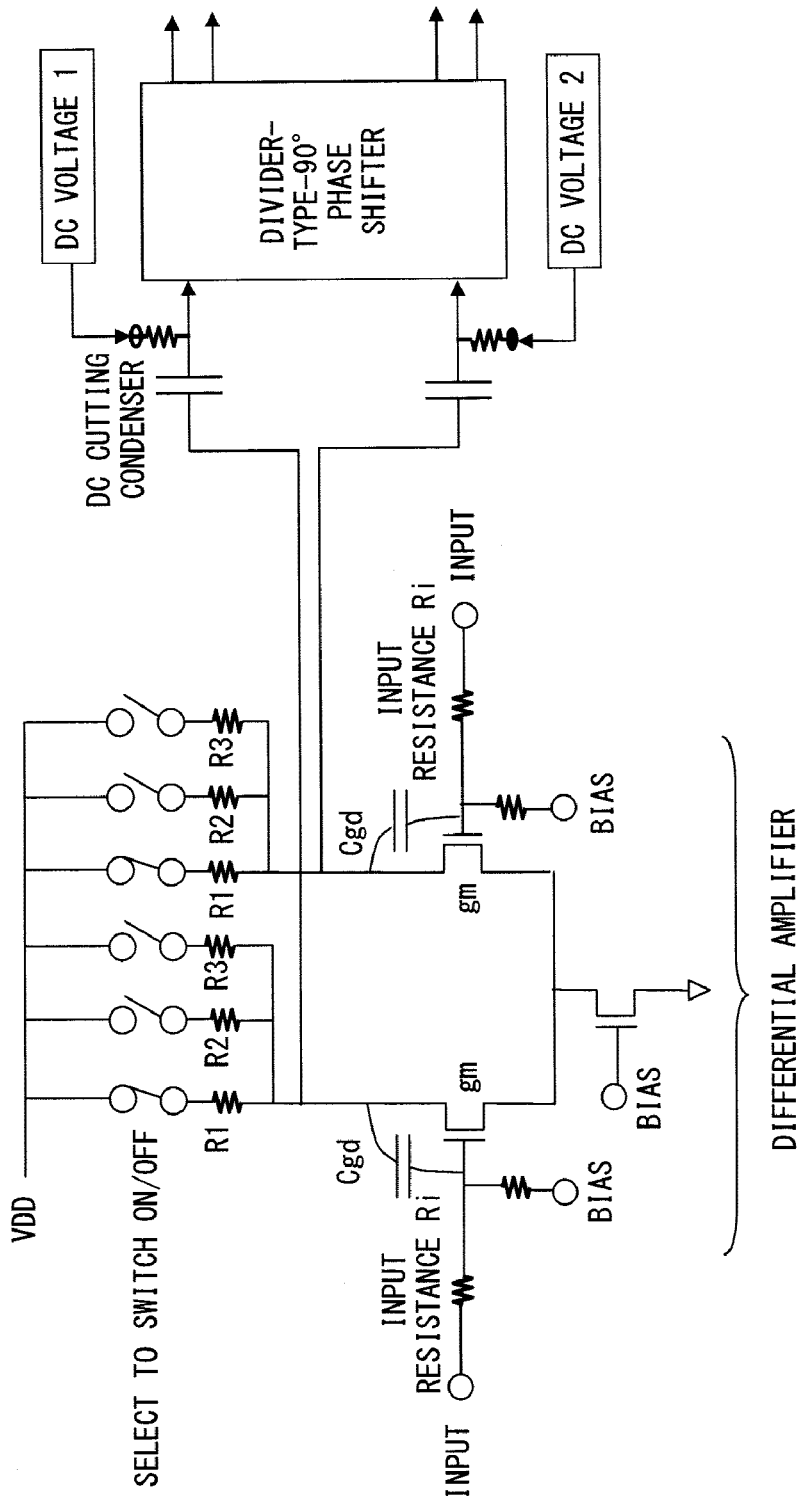
FIG. 11 illustrates an example of the second configuration of moderating rising edges of input signals.

FIG. 11 illustrates a second example of a configuration for moderating rising edges of input signals.

As illustrated in FIG. 11, a differential amplifier is provided in a stage earlier than the phase shifter to increase/decrease load resistance, and thereby a mirror effect can vary the capacitance to achieve the effect of a low-pass filter. It is now assumed that resistance R1 is selected as a load resistance, the capacitance based on a mirror effect is obtained by $C=Cgd\times(1+gm\times R1)$ where gm represents the mutual conductance of the transistor, and Cgd represents the parasitic capacitance between the drain and the gate of the transistor. When the resistance value is R2 or R3, R2 or R3 is used in place of R1 in the above equation. The cutoff frequency of the low-pass filter obtained by this configuration is expressed by $1/(Ri\times C)$ where C is obtained by the first equation, and Ri represents the input resistance value to the transistor. Increased resistance increases the mirror capacitance, and the rising edge of the phase shifter input waveform is moderated by a low-pass filter effect. In this configuration, a circuit including a transistor and a resistor achieves a low-pass filter effect, and accordingly when this circuit is implemented in a LSI configuration, the circuit can be smaller than a configuration using plural capacitors so as to achieve the variability of capacitance, although this causes the circuit configuration to become complicated to some extent.

Figure 12:
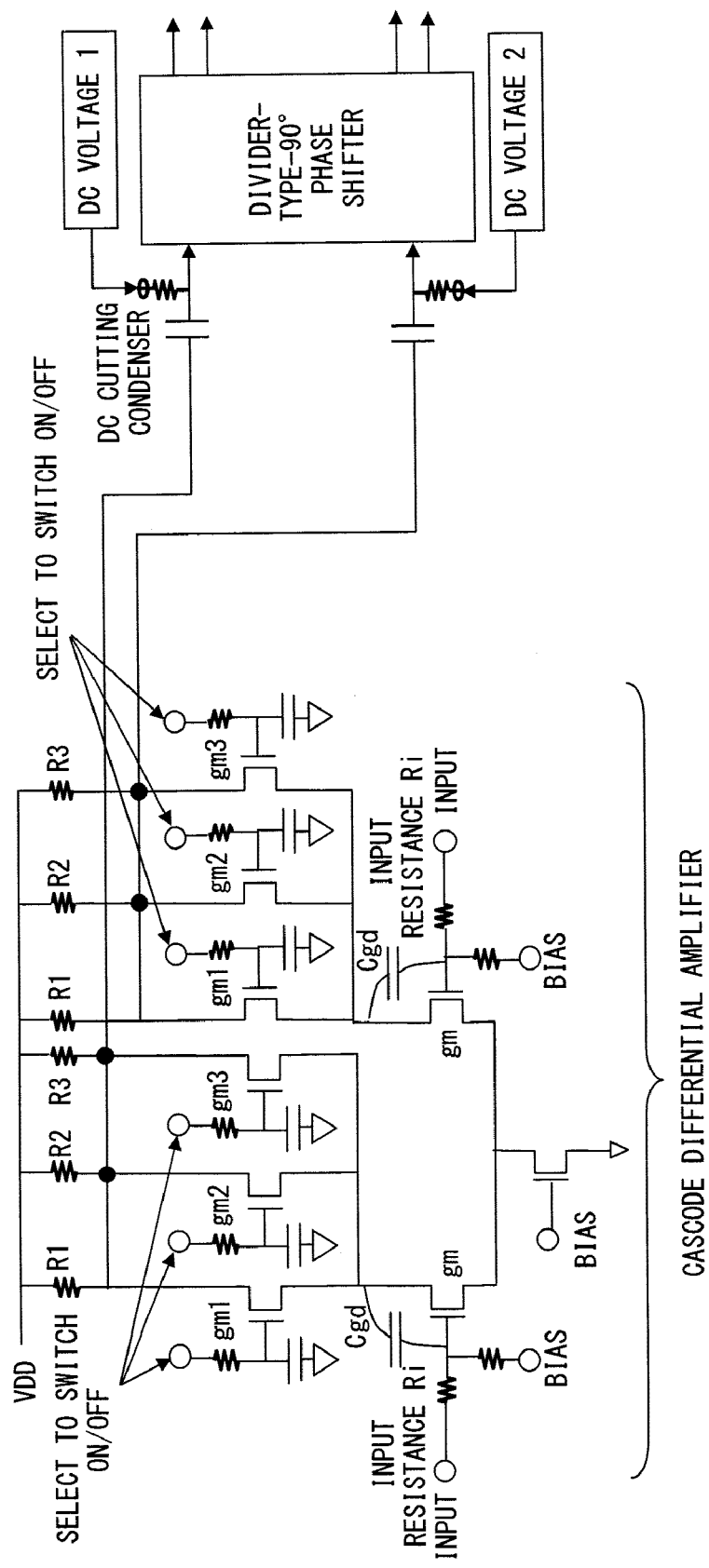
FIG. 12 illustrates an example of the third configuration of moderating rising edges of input signals.

FIG. 12 illustrates the third example of a configuration of moderating the rising edges of input signals.

A cascode differential amplifier is provided in a stage earlier than the phase shifter to increase/decrease the mutual conductance of the grounded-gate amplifier connected to the drain of the input transistor so that a mirror effect can vary the capacitance to achieve the effect of a low-pass filter. Transistors gm, gm1, gm2, and gm3 represent transistors with mutual conductances gm, gm1, gm2, and gm3, respectively. The symbol Cgd represents a parasitic capacitance between the drain and the gate of the transistor. A cascode differential amplifier using a transistor whose gm is gm1 has a capacitance of $C=Cgd\times(1+gm/gm1)$. The cutoff frequency of the low-pass filter is obtained by $1/(Ri\times C)$, where Ri represents an input resistance. Also in this case, the cascode differential amplifier does not include a capacitor when the circuit is configured in an LSI configuration. Thereby, the circuit can be smaller.

FIG. 13 illustrates the fourth example of a configuration of moderating the rising edges of input signals.

The integrated circuit utilizes its wiring capacity to achieve the effect of a low-pass filter. The wider and closer to the bottom the wires are, the larger the wiring capacity can be. As illustrated in FIG. 13, a metal wire 35 is provided as a lower-layer wire close to the GND layer of the LSI including plural layers. Further, the width of the wire is broad so that it has the greatest capacity. A metal wire 36 is provided as a lower-layer wire; however, the width thereof is narrower than that of the metal wire 35, and thus the capacity of the metal wire 36 is smaller than that of the metal wire 35. A metal wire 37 is provided as an upper-layer wire, and the width thereof is not wide, and accordingly the capacity thereof is the smallest. The metal wire 35 is the most effective, the metal wire 36 is the second most effective, and the metal wire 37 is the third most effective in moderating the rising edges of signals.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A phase shifter, comprising:
a phase shifting unit to operate at a timing at which a clock signal becomes equal to or greater than a threshold value and outputting periodic signals having phases shifted by 90 degrees from each other;
a DC voltage setting unit to set a voltage value of a DC component of the clock signal input into the phase shifting unit; and
a clock signal slope varying unit to vary a slope of a rising edge of the clock signal,
wherein the clock signal slope varying unit includes a low-pass filter including capacitors of different capacitances and determines whether to select at least one of capacitors based on an adjustment range according to the voltage value of a DC component.

2. A phase shifter, comprising:
a phase shifting unit to operate at a timing at which a clock signal becomes equal to or greater than a threshold value and outputting periodic signals having phases shifted by 90 degrees from each other;
a DC voltage setting unit to set a voltage value of a DC component of the clock signal input into the phase shifting unit; and
a clock signal slope varying unit to vary a slope of a rising edge of the clock signal,
wherein the clock signal slope varying unit is a differential amplifier including load resistors of different resistance values.

3. A phase shifter, comprising:
a phase shifting unit to operate at a timing at which a clock signal becomes equal to or greater than a threshold value and outputting periodic signals having phases shifted by 90 degrees from each other;
a DC voltage setting unit to set a voltage value of a DC component of the clock signal input into the phase shifting unit; and
a clock signal slope varying unit to vary a slope of a rising edge of the clock signal,
wherein the clock signal slope varying unit is a cascode differential amplifier including transistors of different mutual conductances.

4. A phase shifter, comprising:
a phase shifting unit to operate at a timing at which a clock signal becomes equal to or greater than a threshold value and outputting periodic signals having phases shifted by 90 degrees from each other;
a DC voltage setting unit to set a voltage value of a DC component of the clock signal input into the phase shifting unit; and
a clock signal slope varying unit to vary a slope of a rising edge of the clock signal,
wherein the clock signal slope varying unit includes metal wires formed on a semiconductor integrated circuit, said metal wires being apart from a GND layer by different distances or having different widths; and
a switch for selecting a metal wire to be connected.

5. The phase shifter according to claim 1, wherein:
the clock signal includes two signals having phases shifted 180 degrees from each other; and
the DC voltage setting unit and the clock signal slope varying unit are provided to each of the two signals.

6. A phase shifter, comprising:
a phase shifting unit to operate at a timing at which a clock signal becomes equal to or greater than a threshold value and outputting periodic signals having phases shifted by 90 degrees from each other;
a DC voltage setting unit to set a voltage value of a DC component of the clock signal input into the phase shifting unit; and
a clock signal slope varying unit to vary a slope of a rising edge of the clock signal,
wherein the DC voltage setting unit includes a condenser to remove a DC component from the clock signal and a DC power source to supply a desired DC voltage to the clock signal from which the DC component has been removed.

7. A phase shifter, comprising:
a phase shifting unit to operate at a timing at which a clock signal becomes equal to or greater than a threshold value and outputting periodic signals having phases shifted by 90 degrees from each other;
a DC voltage setting unit to set a voltage value of a DC component of the clock signal input into the phase shifting unit; and
a clock signal slope varying unit to vary a slope of a rising edge of the clock signal,
wherein the phase shifting unit generates periodic signals having cycles that are twice that of the clock signal and having phases shifted by 90 degrees from each other.

* * * * *

UNITED STATES PATENT AND TRADEMARK OFFICE
CERTIFICATE OF CORRECTION

| | | |
|---|---|---|
| PATENT NO. | : 7,876,143 B2 | Page 1 of 1 |
| APPLICATION NO. | : 12/542459 | |
| DATED | : January 25, 2011 | |
| INVENTOR(S) | : Takao Sasaki | |

It is certified that error appears in the above-identified patent and that said Letters Patent is hereby corrected as shown below:

Title Page, insert the following:

--(63) Related U.S. Application Data: Continuation of Application No. PCT/JP2007/000174, filed on March 6, 2007.--.

Signed and Sealed this
Eighth Day of November, 2011

David J. Kappos
*Director of the United States Patent and Trademark Office*